(12) United States Patent
Nakashoya et al.

(10) Patent No.: US 12,420,307 B2
(45) Date of Patent: Sep. 23, 2025

(54) SUBSTRATE PROCESSING METHOD AND SUBSTRATE PROCESSING SYSTEM

(71) Applicant: Tokyo Electron Limited, Tokyo (JP)

(72) Inventors: Takahito Nakashoya, Hillsboro, OR (US); Takayuki Matsukawa, Hillsboro, OR (US)

(73) Assignee: TOKYO ELECTRON LIMITED, Tokyo (JP)

( * ) Notice: Subject to any disclaimer, the term of this patent is extended or adjusted under 35 U.S.C. 154(b) by 120 days.

(21) Appl. No.: 18/515,426

(22) Filed: Nov. 21, 2023

(65) Prior Publication Data
US 2024/0173742 A1    May 30, 2024

(30) Foreign Application Priority Data
Nov. 25, 2022    (JP) ................. 2022-188197

(51) Int. Cl.
*B05D 3/02*    (2006.01)
*B05D 1/02*    (2006.01)

(52) U.S. Cl.
CPC ............. *B05D 3/0218* (2013.01); *B05D 1/02* (2013.01)

(58) Field of Classification Search
CPC ................. B05D 3/0218; B05D 1/02
See application file for complete search history.

(56) References Cited

U.S. PATENT DOCUMENTS

2016/0271657 A1* 9/2016 Sato .......................... B08B 3/10

FOREIGN PATENT DOCUMENTS

JP    2021-057411 A    4/2021

* cited by examiner

*Primary Examiner* — Nathan T Leong
(74) *Attorney, Agent, or Firm* — Chrisman Gallo Tochtrop LLC

(57) ABSTRACT

A substrate processing method includes processing a first surface of a substrate by a chemical liquid supplied to the first surface from a chemical liquid supply; and heating the substrate by starting a supply of a heated fluid to a second surface of the substrate prior to a start of a supply of the chemical liquid to the first surface of the substrate. A temperature of at least one of the chemical liquid to be supplied to the first surface or the heated fluid to be supplied to the second surface is adjusted based on a chemical liquid discharge standby time during which a discharge of the chemical liquid from the chemical liquid supply is not performed continuously.

20 Claims, 6 Drawing Sheets

SUBSTRATE PROCESSING METHOD AND SUBSTRATE PROCESSING SYSTEM

CROSS-REFERENCE TO RELATED APPLICATION

This application claims the benefit of Japanese Patent Application No. 2022-188197 filed on Nov. 25, 2022, the entire disclosures of which are incorporated herein by reference.

TECHNICAL FIELD

The various aspects and embodiments described herein pertain generally to a substrate processing method and a substrate processing system.

BACKGROUND

When manufacturing a semiconductor device, a chemical liquid is supplied to a substrate such as a semiconductor wafer to perform a chemical liquid processing. Such a chemical liquid processing for changing properties such as a surface shape or surface characteristics of the substrate is affected by the temperatures of the substrate and the chemical liquid. Meanwhile, the temperature of the chemical liquid decreases while it diffuses on the substrate toward a peripheral portion thereof, so the peripheral portion of the substrate tends to have a lower temperature than a central portion. As a result, there is caused a discrepancy in the degree of chemical liquid processing between the central portion and the peripheral portion of the substrate due to such a temperature difference.

Patent Document 1 discloses a substrate processing apparatus that improves the in-surface uniformity of the chemical liquid processing by supplying the chemical liquid to a front surface of the substrate while supplying a high-temperature liquid to a rear surface of the substrate to equalize the temperature of the substrate.

Patent Document 1: Japanese Patent Laid-open Publication No. 2021-057411

SUMMARY

In one exemplary embodiment, a substrate processing method includes processing a first surface of a substrate by a chemical liquid supplied to the first surface from a chemical liquid supply; and heating the substrate by starting a supply of a heated fluid to a second surface of the substrate prior to a start of a supply of the chemical liquid to the first surface of the substrate. A temperature of at least one of the chemical liquid to be supplied to the first surface or the heated fluid to be supplied to the second surface is adjusted based on a chemical liquid discharge standby time during which a discharge of the chemical liquid from the chemical liquid supply is not performed continuously.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
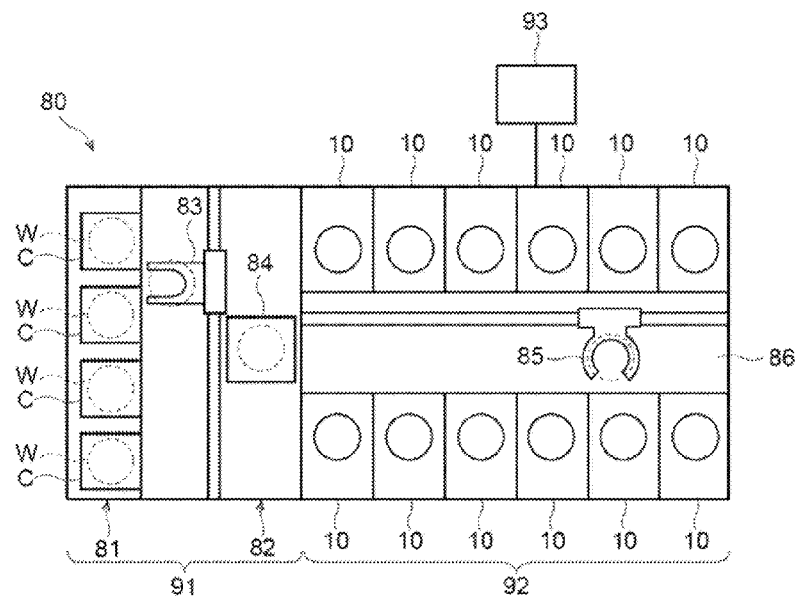
FIG. 1 is a diagram illustrating an outline of an example of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First Exemplary Embodiment

FIG. 1 is a diagram illustrating an outline of an example of a substrate processing system 80.

The substrate processing system 80 shown in FIG. 1 has a carry-in/out station 91 and a processing station 92. The carry-in/out station 91 includes a placing device 81 equipped with a plurality of carriers C, and a transfer device 82 equipped with a first transfer mechanism 83 and a delivery module 84. In each carrier C, a plurality of substrates W is accommodated horizontally. The substrate W is typically made of a semiconductor wafer or a glass substrate, but is not limited thereto. The processing station 92 is equipped with a plurality of processing devices 10 disposed on both sides of a transfer path 86, and a second transfer mechanism 85 configured to be moved back and forth along the transfer path 86.

The substrate W is taken out from the carrier C and loaded in the delivery module 84 by the first transfer mechanism 83, and taken out from the delivery module 84 by the second transfer mechanism 85. Then, the substrate W is carried into the corresponding processing device 10 by the second transfer mechanism 85 to be subjected to a preset processing therein. Thereafter, the substrate W is taken out from the corresponding processing device 10 and transferred in the delivery module 84 by the second transfer mechanism 85, and then returned back into the carrier C in the placing device 81 by the first transfer mechanism 83. Further, the substrate W may be returned back into the carrier C after being subjected to processings in the plurality of processing devices 10.

In the above-described substrate processing system 80, two or more of the plurality of processing devices 10 may have the same configuration or different configurations, and may perform the same processing or different processings. The respective processing devices 10 are capable of performing various processings on the substrate W by applying various kinds of processing fluids (for example, a chemical liquid, a rinse liquid, a cleaning liquid, and so forth) to the substrate W.

The substrate processing system 80 is equipped with a controller 93. The controller 93 is implemented by, for example, a computer, and includes an operation processor and a storage. The storage of the controller 93 stores therein a program and data for various processings performed in the substrate processing system 80. The operation processor of the controller 93 appropriately reads and executes the program stored in the storage to control the various devices of the substrate processing system 80 to perform the various processings.

The program and the data stored in the storage of the controller 93 may have been recorded on a computer-readable recording medium and may be installed from the recording medium into the storage. The computer-readable recording medium may be, by way of non-limiting example, a hard disk (HD), a flexible disk (FD), a compact disk (CD), a magnet optical disk (MO), a memory card, or the like.

As described above, in the substrate processing system 80 shown in FIG. 1, the placing device 81 equipped with the plurality of carriers C serves as a substrate holder configured to hold the plurality of substrates W. Further, each processing device 10 serves as a substrate processing apparatus configured to perform a processing on each substrate W. In addition, the transfer device 82, the first transfer mechanism 83, the delivery module 84, the second transfer mechanism 85, and the transfer path 86 function as a substrate transfer device serving to transfer the respective substrates between the substrate holder and the substrate processing apparatus. Further, the controller 93 functions as a processing controller that controls the substrate processing apparatus.

Figure 2:
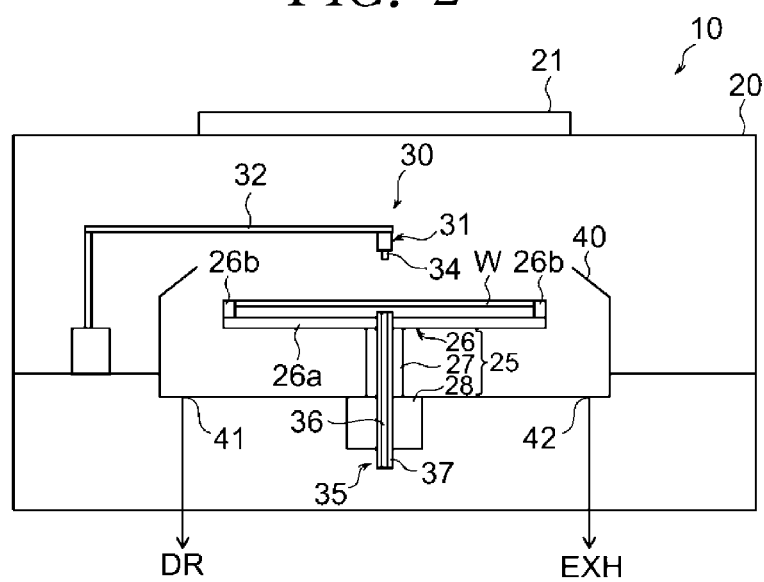
FIG. 2 is a diagram illustrating a configuration example of a processing device.

FIG. 2 is a diagram showing a configuration example of the processing device 10. FIG. 2 presents a perspective view showing an internal configuration of a chamber 20.

The processing device 10 shown in FIG. 2 includes the chamber 20, a substrate rotating/holding mechanism 25, a first processing fluid supply 30 (chemical liquid supply), a second processing fluid supply 35 (fluid supply), and a recovery cup 40.

The substrate rotating/holding mechanism 25 and the recovery cup 40 are disposed inside the chamber 20. A fan filter unit (FFU) 21 is provided at a ceiling portion of the chamber 20. The FFU 21 creates a downflow within the chamber 20.

The substrate rotating/holding mechanism 25 includes a substrate support 26, a supporting column 27, and a rotational driver 28. The substrate support 26 is configured as a mechanical chuck, and has a disk-shaped base 26a and a plurality of gripping claws 26b provided on an outer peripheral portion of the base 26a at a regular distance therebetween in the circumferential direction. The substrate W supported by the substrate support 26 is held in a horizontal posture by the plurality of gripping claws 26b. With the substrate W held by the plurality of gripping claws 26b, a gap is formed between a top surface of the base 26a and a bottom surface of the substrate W.

The supporting column 27 is a vertically extending hollow member. An upper end of the supporting column 27 is coupled to the base 26a. As the rotational driver 28 rotates the supporting column 27, the substrate support 26 and the substrate W held by the substrate support 26 are rotated around a vertical axis.

The recovery cup 40 is disposed to surround the substrate support 26. The recovery cup 40 collects a processing liquid scattered from the substrate W being rotated along with the substrate support 26. The processing liquid collected by the recovery cup 40 is drained from a drain port 41 formed at a bottom of the recovery cup 40 to the outside (a drain DR in the present example) of the chamber 20. A gas in an internal space of the recovery cup 40 is sucked and exhausted to an exhaust device EXH from an exhaust port 42 formed at the bottom of the recovery cup 40. A gas supplied into the chamber 20 from the FFU 21 is drawn into the recovery cup 40 and then exhausted to the outside (exhaust device EXH) of the chamber 20 (processing device 10) through the exhaust port 42.

The first processing fluid supply 30 is configured to supply a processing fluid to a top surface (typically, a front surface of the substrate W on which devices are formed) of the substrate W held by the substrate support 26. The first processing fluid supply 30 includes a first processing fluid discharger 31 configured to discharge the processing fluid toward the front surface (first surface) of the substrate W, and a nozzle arm 32 supporting the first processing fluid discharger 31 in a movable manner. The first processing fluid discharger 31 is equipped with one or more front nozzles 34. Here, the number of the front nozzles 34 of the first processing fluid discharger 31 is not particularly limited. Under the control of the controller 93 (see FIG. 1), the nozzle arm 32 is capable of moving the first processing fluid discharger 31 (particularly, the front nozzle 34) between a processing position approximately directly above a rotation center of the substrate W and a retreat position outside a top opening of the recovery cup 40. A liquid receiving member (not shown) is provided to correspond to the retreat position. Under the control of the controller 93, the first processing fluid discharger 31 is capable of performing a discharge of the processing fluid toward the liquid receiving member (so-called dummy dispensing) at the retreat position.

In the example shown in FIG. 2, only one first processing fluid supply 30 is provided, but a plurality of first processing fluid supplies 30 (for example, a right first processing fluid supply 30 and a left first processing fluid supply 30) may be provided. The type and the number of the processing fluid(s) discharged from the first processing fluid discharger 31 are not particularly limited. In the case where the plurality of first processing fluid supplies 30 are provided, two or more first processing fluid supplies 30 respectively configured to discharge different types of processing fluids may be provided. For example, a chemical liquid and deionized water (DIW) may be discharged from the individual first processing fluid supplies 30. The form of the processing fluid discharged from the first processing fluid supply 30 is not particularly limited. In addition to a processing fluid in a liquid phase, a processing fluid in a gas phase and/or a processing fluid in a gas-liquid mixture may be discharged from the first processing fluid supply 30.

The second processing fluid supply 35 is configured to supply a processing fluid (DIW and hot deionized water (HDIW)) to the bottom surface (typically, a rear surface of the substrate W on which no device is formed) of the substrate W held by the substrate support 26.

The second processing fluid supply 35 has a processing liquid supply pipe 37 equipped with a rear nozzle 36 configured to discharge the processing fluid toward the rear surface (second surface) of the substrate W. In the example shown in FIG. 2, the single rear nozzle 36 is provided in the processing liquid supply pipe 37, but the number of the rear nozzle(s) 36 is not particularly limited. For example, a processing fluid in a liquid phase and a processing fluid in a gas phase may be respectively discharged from separate rear nozzles 36. The processing liquid supply pipe 37 is provided so as to penetrate the substrate support 26, the supporting column 27, and the rotational driver 28, and is always maintained in a non-rotating state regardless of the rotational state of the substrate support 26 and the supporting column 27.

In the present specification, 'HDIW' refers to DIW with a raised temperature, for example, DIW having a temperature higher than a room temperature (an environmental temperature (for example, about 24° C.) of the processing device 10). Meanwhile, 'DIW' may refer to not only DIW in general but also DIW whose temperature is not raised in comparison with the HDIW (that is, DIW having a temperature lower than that of HDIW). For example, it may refer to DIW having the room temperature (the environmental temperature of the processing device 10).

Figure 3:
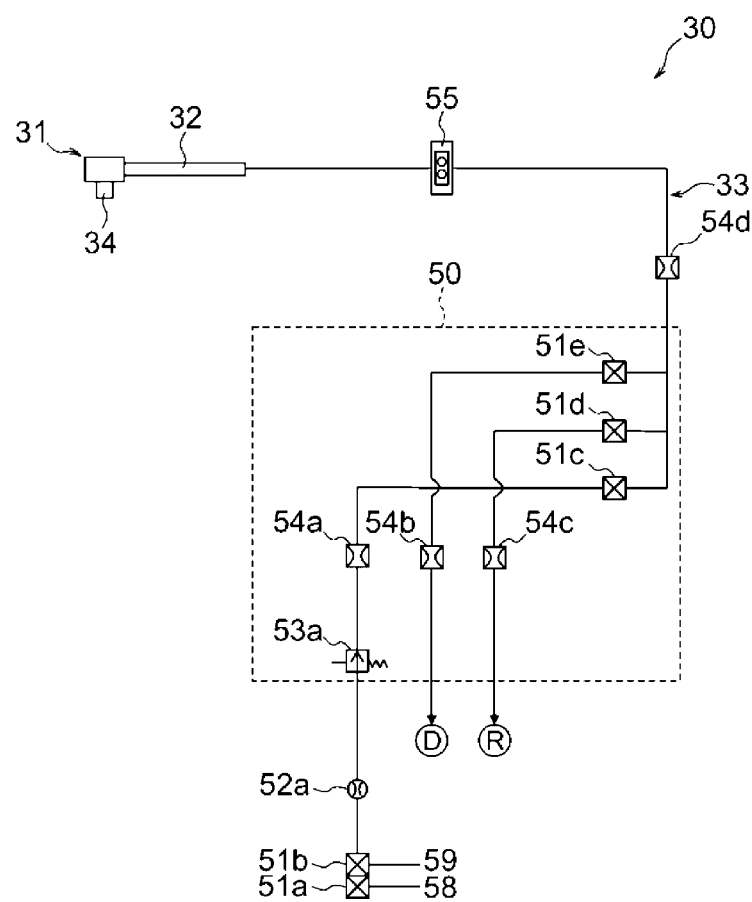
FIG. 3 is a diagram illustrating an example of a pipeline configuration of a first processing fluid supply according to a first exemplary embodiment.

FIG. 3 is a diagram showing an example of a pipeline configuration of the first processing fluid supply 30 according to the first exemplary embodiment.

In the example shown in FIG. 3, the front nozzle 34 of the first processing fluid discharger 31 is connected to a chemical liquid source 58 and a DIW source 59 via a first processing fluid line 33. The front nozzle 34 is configured to discharge the chemical liquid supplied from the chemical liquid source 58 through the first processing fluid line 33 and the DIW supplied from the DIW source 59 through the first processing fluid line 33. Each of the chemical liquid source 58 and the DIW source 59 may have any of various forms, such as, but not limited to, a tank, a cylinder, or a factory power supply.

A flow path leading to the chemical liquid source 58 is connected to the first processing fluid line 33 via a first opening/closing valve 51a. A flow path leading to the DIW source 59 is connected to the first processing fluid line 33 via a second opening/closing valve 51b.

The first processing fluid line 33 is provided with a first flow meter 52a, a first constant-pressure valve 53a, a first orifice 54a, a third opening/closing valve 51c, a fourth orifice 54d, and a clamp 55 in sequence from the first opening/closing valve 51a and the second opening/closing valve 51b toward the first processing fluid discharger 31. The clamp 55 connects a flow path leading to the first processing fluid discharger 31 to a flow path extending from the first opening/closing valve 51a and the second opening/closing valve 51b to thereby allow the processing fluid to flow therebetween. The flow path leading to the first processing fluid discharger 31 is extended along at least a part of the nozzle arm 32 to be connected to the front nozzle 34.

A flow path leading to the tank R and a flow path leading to a drain D are branched off from a portion of the first processing fluid line 33 between the third opening/closing valve 51c and the fourth orifice 54d. The branch flow path leading to the tank R is provided with a fourth opening/closing valve 51d and a third orifice 54c in sequence toward the tank R. The branch flow path leading to the drain D is provided with a fifth opening/closing valve 51e and a second orifice 54b in sequence toward the drain D.

Opening and closing of the first to fifth opening/closing valves 51a to 51e are performed under the control of the controller 93 (see FIG. 1). The first flow meter 52a measures a flow rate of the processing fluid (chemical liquid/DIW) flowing through the first processing fluid line 33 (particularly, a portion thereof between the first constant-pressure valve 53a and the first and second opening/closing valves 51a and 51b), and sends the measurement result to the controller 93.

When supplying the chemical liquid from the chemical liquid source 58 to the first processing fluid discharger 31 (chemical liquid discharger) via the first processing fluid line 33 (chemical liquid line), the first opening/closing valve 51a and the third opening/closing valve 51c are opened. In this case, the second opening/closing valve 51b, the fourth opening/closing valve 51d, and the fifth opening/closing valve 51e may be closed. Meanwhile, when supplying the DIW from the DIW source 59 to the first processing fluid discharger 31, the second opening/closing valve 51b and the third opening/closing valve 51c are opened. In this case, the first opening/closing valve 51a, the fourth opening/closing valve 51d, and the fifth opening/closing valve 51e may be closed.

When discharging the processing fluid (chemical liquid/DIW) in the first processing fluid line 33 to the tank R, the fourth opening/closing valve 51d is opened. When discharging the processing fluid (chemical liquid/DIW) in the first processing fluid line 33 to the drain D, the fifth opening/closing valve 51e is opened.

In addition, the third to fifth opening/closing valves 51c to 51e, the first to third orifices 54a to 54c, and the first constant-pressure valve 53a described above are disposed in a block-shaped integrated valve main body 50 and handled as a single unit.

Figure 4:
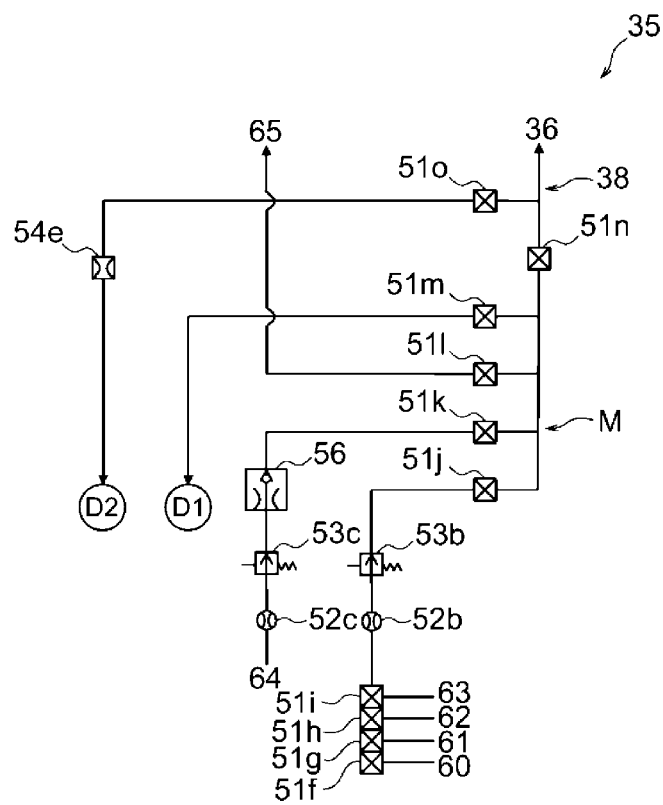
FIG. 4 is a diagram illustrating an example of a pipeline configuration of a second processing fluid supply.

FIG. 4 is a diagram showing an example of a pipeline configuration of the second processing fluid supply 35.

In the example shown in FIG. 4, the rear nozzle 36 of the second processing fluid supply 35 is connected to a chemical liquid source 60, a diluted ammonia water source 61, a HDIW source 62, a DIW source 63, and a DIW source 64 via a second processing fluid line 38. The rear nozzle 36 is configured to discharge a chemical liquid supplied from the chemical liquid source 60 via the second processing fluid line 38, diluted ammonia water supplied from the diluted ammonia water source 61 via the second processing fluid line 38, and HDIW supplied from the HDIW source 62 via the second processing fluid line 38. Further, the rear nozzle 36 also discharges DIW that is supplied from each of the DIW source 63 and the DIW source 64 via the second processing fluid line 38. The DIW source 63 and the DIW source 64 may be separate DIW sources, or may be a common DIW source.

The HDIW supplied from the HDIW source 62 is a heated fluid having a temperature higher than that of the DIW supplied from the DIW source 63 and the DIW source 64. Each of the chemical liquid source 60, the diluted ammonia water source 61, the HDIW source 62, the DIW source 63, and the DIW source 64 has any of various forms, such as, but not limited to, a tank, a cylinder, or a factory power supply.

A flow path leading to the chemical liquid source 60 is connected to the second processing fluid line 38 via a sixth opening/closing valve 51$f$. A flow path leading to the diluted ammonia water source 61 is connected to the second processing fluid line 38 via a seventh opening/closing valve 51$g$. A flow path leading to the HDIW source 62 is connected to the second processing fluid line 38 via an eighth opening/closing valve 51$h$. A flow path leading to the DIW source 63 is connected to the second processing fluid line 38 via a ninth opening/closing valve 51$i$.

The second processing fluid line 38 is provided with a second flow meter 52$b$, a second constant-pressure valve 53$b$, a tenth opening/closing valve 51$j$, and a fourteenth opening/closing valve 51$n$ in sequence from the sixth to ninth opening/closing valves 51$f$ to 51$i$ toward the rear nozzle 36.

A flow path leading to the DIW source 64, a flow path leading to a chamber cleaning device 65, and a flow path leading to a first drain D1 are branched off from a portion of the second processing fluid line 38 between the tenth opening/closing valve 51$j$ and the fourteenth opening/closing valve 51$n$. Further, a flow path leading to a second drain D2 is branched off from a portion of the second processing fluid line 38 between the fourteenth opening/closing valve 51$n$ and the rear nozzle 36. The first drain D1 and the second drain D2 may be separate drains or may be a common drain.

The branch flow path leading to the DIW source 64 is provided with a third flow meter 52$c$, a third constant-pressure valve 53$c$, an orifice 56 with a check valve, and an eleventh opening/closing valve 51$k$ in sequence from the DIW source 64 side. The branch flow path leading to the chamber cleaning device 65 is provided with a twelfth opening/closing valve 51$l$. The branch flow path leading to the first drain D1 is provided with a thirteenth opening/closing valve 51$m$. The branch flow path leading to the second drain D2 is provided with a fifteenth opening/closing valve 51$o$ and a fifth orifice 54$e$ in sequence toward the second drain D2.

Opening and closing of the sixth to fifteenth opening/closing valves 51$f$ to 51$o$ are performed under the control of the controller 93 (see FIG. 1). The second flow meter 52$b$ measures a flow rate of the processing fluid (chemical liquid/diluted ammonia water/HDIW/DIW) flowing through the second processing fluid line 38 (particularly, a portion between the second constant-pressure valve 53$b$ and the sixth to ninth opening closing valves 51$f$ to 51$i$), and sends the measurement result to the controller 93. The third flow meter 52$c$ measures a flow rate of the processing fluid (DIW) flowing through the second processing fluid line 38 (particularly, a portion between the DIW source 64 and the third constant-pressure valve 53$c$), and sends the measurement result to the controller 93.

When supplying the chemical liquid from the chemical liquid source 60 to the rear nozzle 36, the sixth opening/closing valve 51$f$, the tenth opening/closing valve 51$j$, and the fourteenth opening/closing valve 51$n$ are opened. In this case, the seventh to ninth opening/closing valves 51$g$ to 51$i$, the eleventh to thirteenth opening/closing valves 51$k$ to 51$m$, and the fifteenth opening/closing valve 51$o$ may be closed.

When supplying the diluted ammonia water from the diluted ammonia water source 61 to the rear nozzle 36, the seventh opening/closing valve 51$g$, the tenth opening/closing valve 51$j$, and the fourteenth opening/closing valve 51$n$ are opened. In this case, the sixth opening/closing valve 51$f$, the eighth opening/closing valve 51$h$, the ninth opening/closing valve 51$i$, the eleventh to thirteenth opening/closing valves 51$k$ to 51$m$, and the fifteenth opening/closing valve 51$o$ may be closed.

When supplying the HDIW from the HDIW source 62 to the rear nozzle 36, the eighth opening/closing valve 51$h$, the tenth opening/closing valve 51$j$, and the fourteenth opening/closing valve 51$n$ are opened. In this case, the sixth opening/closing valve 51$f$, the seventh opening/closing valve 51$g$, the ninth opening/closing valve 51$i$, the eleventh to thirteenth opening/closing valves 51$k$ to 51$m$, and the fifteenth opening/closing valve 51$o$ may be closed.

When supplying the DIW from the DIW source 63 to the rear nozzle 36, the ninth opening/closing valve 51$i$, the tenth opening/closing valve 51$j$, and the fourteenth opening/closing valve 51$n$ may be opened. In this case, the sixth to eighth opening/closing valves 51$f$ to 51$h$, the eleventh to thirteenth opening/closing valves 51$k$ to 51$m$, and the fifteenth opening/closing valve 51$o$ may be closed.

When supplying the DIW from the DIW source 64 to the rear nozzle 36, the eleventh opening/closing valve 51$k$ and the fourteenth opening/closing valve 51$k$ are opened. In this case, the sixth to tenth opening/closing valves 51$f$ to 51$j$, the twelfth opening/closing valve 51$l$, the thirteenth opening/closing valve 51$m$, and the fifteenth opening/closing valve 51$o$ may be closed.

When supplying a mixed DIW (i.e., HDIW) of the HDIW from the HDIW source 62 and the DIW from the DIW source 64 to the rear nozzle 36, the eighth opening/closing valve 51$h$, the tenth opening/closing valve 51$j$, the eleventh opening/closing valve 51$k$, and the fourteenth opening/closing valve 51$n$ are opened. In this case, the sixth opening/closing valve 51$f$, the seventh opening/closing valve 51$g$, the ninth opening/closing valve 51$i$, the twelfth opening/closing valve 51$l$, the thirteenth opening/closing valve 51$m$, and the fifteenth opening/closing valve 51$o$ may be closed. The HDIW from the HDIW source 62 and the DIW from the DIW source 64 join each other in a mixing zone M where the pipeline from the HDIW source 62 and the pipeline from the DIW source 64 are connected, and flow downstream as the mixed DIW.

Here, the temperature of the mixed DIW changes depending on a mixing ratio of the HDIW from the HDIW source 62 and the DIW from the DIW source 64. The temperature of this mixed DIW is higher than the temperature of the DIW from the DIW source 64 and lower than the temperature of the HDIW from the HDIW source 62. In this example, by adjusting the opening degree of the eighth opening/closing valve 51$h$, the tenth opening/closing valve 51$j$, and/or the eleventh opening/closing valve 51$k$ under the control of the controller 93 (see FIG. 1), the temperature of the HDIW (mixed DIW) to be supplied to the rear nozzle 36 is adjusted. When supplying the HDIW of a relatively high temperature to the rear nozzle 36, the opening degree of the eighth opening/closing valve 51$h$, the tenth opening/closing valve 51$j$, and/or the eleventh opening/closing valve 51$k$ is adjusted such that the mixing ratio of the HDIW from the HDIW source 62 to the DIW from the DIW source 64 becomes relatively large. Meanwhile, when supplying the HDIW of a relatively low temperature to the rear nozzle 36, the opening degree of the eighth opening/closing valve 51$h$, the tenth opening/closing valve 51$j$, and/or the eleventh opening/closing valve 51$k$ is adjusted such that the mixing ratio of the HDIW from the HDIW source 62 to the DIW from the DIW source 64 becomes relatively small.

Figure 5:
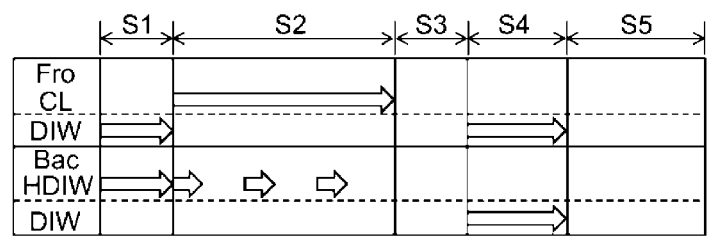
FIG. 5 is a conceptual diagram showing an example of a processing sequence of a substrate processing method.

FIG. 5 is a conceptual diagram showing an example of a processing sequence of a substrate processing method. The controller 93 controls the individual components of the substrate processing system 80 appropriately (see FIG. 1), so that the substrate processing method (including a substrate heating process and a chemical liquid processing process) to be described below is carried out by the corresponding processing device 10.

In FIG. 5, the upper row Fro indicates a liquid processing on the front surface of the substrate W, and the lower row Bac indicates a liquid processing on the rear surface of the substrate W. In the upper row Fro of FIG. 5, 'CL' on the upper side indicates whether or not a chemical liquid used in a chemical liquid processing (e.g., an etching processing) is discharged, and 'DIW' on the lower side indicates whether or not DIW used in a DIW processing is discharged. In the lower row Bac of FIG. 5, 'HDIW' on the upper side indicates whether or not HDIW used in a HDIW processing is discharged, and 'DIW' on the lower side indicates whether or not DIW used in a DIW processing is discharged. The HDIW applied to the substrate W in the HDIW processing of the lower row Bac in FIG. 5 has a higher temperature than the DIW applied to the substrate W in each of the DIW processings of the upper row Fro and the lower row Bac.

According to the substrate processing method shown in FIG. 5, a preliminary processing process S1, a chemical liquid discharging process S2 (chemical liquid processing process), a spin-off process S3, a rinsing process S4, and a drying process S5 are performed sequentially on each substrate W as a processing target.

In the preliminary processing process S1, the DIW is applied to the front surface of the substrate W from the first processing fluid discharger 31 (front nozzle 34), and the HDIW is applied to the rear surface of the substrate W from the second processing fluid supply 35 (rear nozzle 36), so that the substrate W is preliminarily heated and gets wet. In this way, by starting the supply of the HDIW to the rear surface of the substrate W prior to the start of the supply of the chemical liquid to the front surface of the substrate W, the substrate W is heated. As a result, prior to the chemical liquid processing on the front surface of the substrate W, the substrate W can be warmed from the rear surface side by the HDIW, so that the subsequent chemical liquid processing (chemical liquid discharging process S2) can be performed efficiently from the beginning. In the present exemplary embodiment, the temperature of the HDIW supplied to the rear surface of the substrate W in the preliminary processing process S1 is higher than the temperature of the chemical liquid supplied to the front surface of the substrate W in the chemical liquid discharging process S2.

In the chemical liquid discharging process S2, the chemical liquid (for example, an etching liquid) discharged from the first processing fluid discharger 31 is applied to the front surface of the substrate W, and the HDIW discharged from the second processing fluid supply 35 is applied to the rear surface of the substrate W. As a result, while warming the substrate W by the HDIW from the second processing fluid supply 35, the chemical liquid processing process of processing the front surface of the substrate W by the chemical liquid supplied to the front surface thereof from the first processing fluid discharger 31 is performed. In the chemical liquid discharging process S2 in the example shown in FIG. 5, the HDIW is intermittently discharged from the second processing fluid supply 35 to be applied to the rear surface of the substrate W.

In this way, in the present exemplary embodiment, substrate heating process of heating the substrate W through the supply of the HDIW from the second processing fluid supply 35 to the rear surface of the substrate W is performed in the preliminary processing process S1 and the chemical liquid discharging process S2. That is, the supply of the HDIW to the rear surface of the substrate W is started before the start of the supply of the chemical liquid to the front surface of the substrate W in the chemical liquid discharging process S2. After the start of the supply of the chemical liquid to the front surface of the substrate W in the chemical liquid discharging process S2, the supply of the HDIW to the rear surface of the substrate W is ended.

In the spin-off process S3, the substrate W is rotated by the substrate rotating/holding mechanism 25 in the state that the discharge of the processing fluid (including the chemical liquid and the DIW) from the first processing fluid discharger 31 and the discharge of the processing fluid (including the HDIW) from the second processing fluid supply 35 are stopped. As a result, the liquids are shaken off from the front and the rear surfaces of the substrate W.

In the rinsing process S4, the DIW is applied to the front surface of the substrate W from the first processing fluid discharger 31, and the DIW is applied to the rear surface of the substrate W from the second processing fluid supply 35, so that the front surface and the rear surface of the substrate W are washed by the DIW. In the rinsing process S4, the DIW discharged from the second processing fluid supply 35 is not HDIW but DIW that is not heated, and may have a temperature approximately equal to the temperature (for example, an environmental temperature (room temperature)) of the DIW discharged from the first processing fluid discharger 31, for example. In this way, after the supply of the chemical liquid from the first processing fluid supply 30 to the front surface of the substrate W is ended, a post-processing of supplying, to the rear surface of the substrate W, the processing fluid (DIW in the present exemplary embodiment) having the temperature lower than that of the HDIW supplied to the rear surface of the substrate W in the substrate heating process is carried out.

In the drying process S5, the substrate W is rotated by the substrate rotating/holding mechanism 25 in the state that the discharge of the processing fluid (including the chemical liquid and the DIW) from the first processing fluid discharger 31 and the discharge of the processing fluid (including the HDIW) from the second processing fluid supply 35 are stopped. As a result, the liquids are shaken off from the front surface and the rear surface of the substrate W, so that the front surface and the rear surface of the substrate W are dried.

The processing sequence of the substrate processing method described above is nothing more than an example, and other processings may be performed before, during, and/or after each of the processes S1 to S5. For example, a dummy dispensing process of discharging the processing fluid from the first processing fluid discharger 31 prior to the preliminary processing process S1 may be performed to remove particles from the first processing fluid line 33.

In the above-described substrate processing method, the temperature of at least one of the chemical liquid supplied to the front surface of the substrate W and the HDIW supplied to the rear surface of the substrate W is adjusted based on a chemical liquid discharge standby time during which the discharge of the chemical liquid from the first processing fluid discharger 31 is not performed continuously. In particular, in the present exemplary embodiment, the HDIW whose temperature has been adjusted based on the chemical liquid discharge standby time is supplied to the rear surface of the substrate W at least in the preliminary processing process S1.

Figure 6:
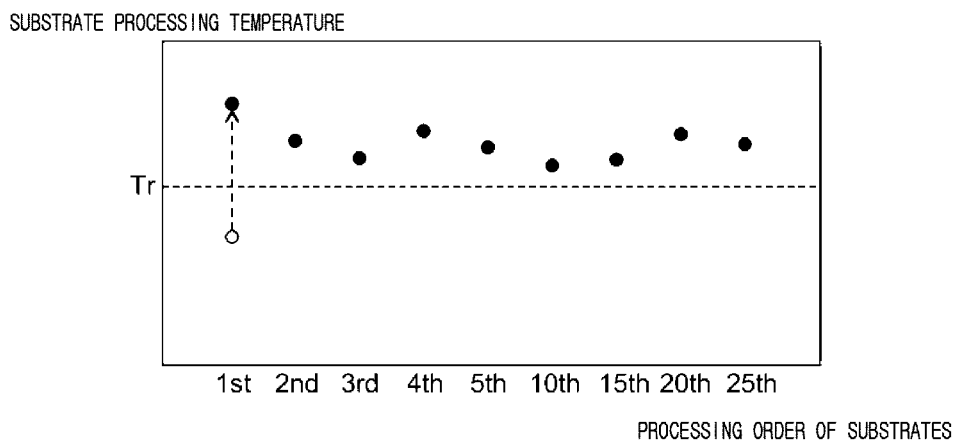
FIG. 6 is a graph showing an example of a relationship between a substrate processing order and a substrate processing temperature.

FIG. 6 presents a graph showing an example of a relationship between a substrate processing order and a substrate processing temperature. The horizontal axis of FIG. 6 represents the order ('substrate processing order') in which the substrates W are processed, and the vertical axis of FIG. 6 represents the temperature of the substrates W when they are subjected to the chemical liquid processing (chemical liquid discharging process S2). The temperature of the substrate W may be measured by any of various methods. For example, the temperature of the substrate W may be measured directly by using a temperature sensor. Alternatively, when a 'processing liquid (for example, a chemical liquid) on the substrate W' is present between the temperature sensor and the substrate W, the temperature of the processing liquid on the substrate W may be regarded as being substantially equal to the temperature of the substrate W. Thus, the temperature of the substrate W may be measured indirectly by measuring the temperature of the processing liquid on the substrate W.

In FIG. 6, '1st' refers to a first substrate W to be processed by the chemical liquid supplied from the first processing fluid discharger 31 after the chemical liquid discharge standby time exceeds a reference standby time in the processing device 10. Further, in the processing device 10, second to fifth substrates W to be processed by the chemical liquid supplied from the first processing fluid discharger 31 after the chemical liquid discharge standby time exceeds the reference standby time are denoted by '2nd', '3rd', '4th', and '5th' in FIG. 6, respectively. Likewise, '10th', '15th', '20th', and '25th' in FIG. 6 represent a tenth, a fifteenth, a twentieth, and a twenty-fifth substrates W to be processed.

'Tr' shown in FIG. 6 represents a reference processing temperature, which indicates a reference temperature (for example, a minimum temperature) of the substrate W that is considered desirable for the substrate W to be properly subjected to the chemical liquid processing. In order for the substrate W to be properly subjected to the chemical liquid processing, it is desirable that the substrate W and the chemical liquid on the substrate W have a temperature equal to or higher than the reference processing temperature Tr. The reference processing temperature Tr is appropriately determined based on the properties of the substrate W and the characteristics of the chemical liquid.

In general, when the chemical liquid is discharged from the first processing fluid supply 30 without staying, the chemical liquid is adjusted to a temperature equal to or higher than the reference processing temperature Tr on the substrate W, and is supplied from the chemical liquid source 58 to the first processing fluid line 33 of the first processing fluid supply 30.

However, as the chemical liquid discharge standby time lengthens, the temperature of the chemical liquid remaining in the first processing fluid supply 30 gradually decreases. When the supply of the chemical liquid from the first processing fluid supply 30 to the substrate W is resumed, the new chemical liquid adjusted to the required temperature is gradually supplied to the first processing fluid supply 30. However, the substrate W processed first after the supply of the new chemical liquid is resumed is supplied with the remaining chemical liquid whose temperature has decreased. As a result, the temperature of the substrate W that is processed first by the chemical liquid supplied from the first processing fluid supply 30 after the chemical liquid discharge standby time exceeds the reference standby time falls below the reference processing temperature Tr (see a white-circle plot in FIG. 6), causing the chemical liquid processing of the first substrate W to become insufficient.

After all of the remaining chemical liquid whose temperature has decreased is discharged from the first processing fluid discharger 31, the chemical liquid with the required set temperature newly supplied to the first processing fluid supply 30 is discharged from the first processing fluid discharger 31 toward the substrate W. Therefore, the substrate W can appropriately undergo the chemical liquid processing in the state that its temperature exceeds the reference processing temperature Tr (see black-circle plots in FIG. 6). Thus, if the processing device 10 performs the processing on all of the plurality of substrates W in the same way, some of the plurality of substrates W may be processed by using the chemical liquid whose temperature is lower than the required set temperature, while the others are processed by using the chemical liquid of the required set temperature.

Figure 7:
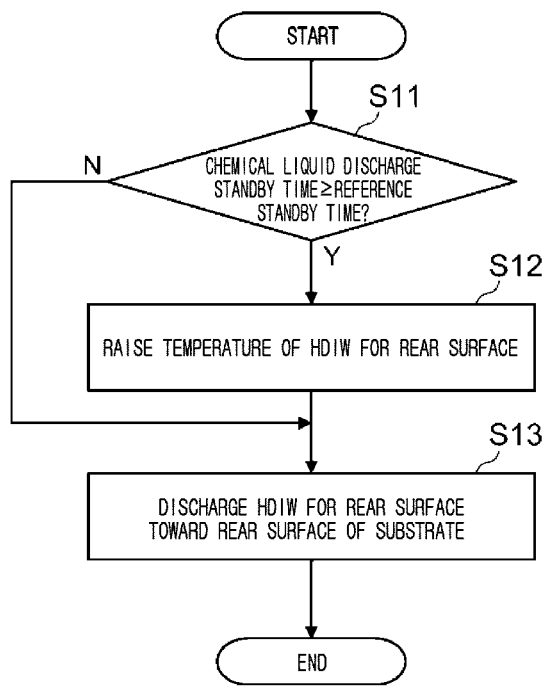
FIG. 7 is a flowchart illustrating an example of a processing flow (particularly, a substrate temperature adjustment flow) of the substrate processing method according to the first exemplary embodiment.

FIG. 7 is a flowchart showing an example of a processing flow (particularly, a substrate temperature adjustment flow) of the substrate processing method according to the first exemplary embodiment.

In the present exemplary embodiment, the controller 93 counts the chemical liquid discharge standby time. Here, the controller 93 does not necessarily need to count, as the chemical liquid discharge standby time, the exact time during which the chemical liquid is not discharged from the first processing fluid supply 30, but may count the time of other states that indirectly indicates the chemical liquid discharge standby time. As an example, the controller 93 may set a time period until the processing status in the processing device 10 switches from an end of the processing of a preceding lot to a start of the processing of a next lot as the chemical liquid discharge standby time.

When the chemical liquid discharge standby time becomes longer than the reference standby time (Y in S11 of FIG. 7), the temperature of the HDIW that is scheduled to be supplied from the second processing fluid supply 35 to the rear surface of the substrate W is raised (S12) under the control of the controller 93. That is, the temperature of the HDIW to be supplied in the preliminary processing process S1 is increased for the substrate W (for example, a first substrate W of a lot) to be processed first by the chemical liquid supplied from the first processing fluid supply 30 after the chemical liquid discharge standby time exceeds the reference standby time. Although a specific temperature of the HDIW raised in this way is not particularly limited, it may be higher than the temperature (set temperature) of the HDIW supplied to the substrate W when the chemical liquid discharge standby time does not exceed the reference standby time.

Further, the second processing fluid supply 35 shown in FIG. 4 continuously performs the temperature adjustment of the HDIW in the mixing zone M and the discharge of the HDIW from the rear nozzle 36. In this case, the above-described HDIW temperature raising process S12 and a HDIW discharging process S13 to be described later are performed simultaneously.

On the other hand, when the chemical liquid discharge standby time is less than the reference standby time (N in S11), the HDIW temperature raising process S12 is skipped, and the HDIW scheduled to be supplied in the preliminary processing process S1 is not heated and has a normal set temperature.

Thereafter, in the 'preliminary processing process S1 for the first substrate W' performed immediately before the supply of the chemical liquid from the first processing fluid supply 30 to the substrate W is resumed, the HDIW is supplied to the rear surface of the substrate W from the second processing fluid supply 35 (S13).

That is, when the chemical liquid discharge standby time is equal to or larger than the reference standby time, the HDIW heated to a temperature higher than the normal set temperature is applied to the rear surface of the substrate W. Accordingly, prior to the application of the chemical liquid to the first substrate W (chemical liquid discharging process S2), the temperature of the first substrate W is adjusted to be higher than the temperature of the substrate W in a normal processing. As a result, the chemical liquid supplied in the chemical liquid discharging process S2 for the first substrate W has a temperature exceeding the reference processing temperature Tr (see the black-circle plot of '1st' in FIG. 6) on the first substrate W, which also has the temperature exceeding the reference processing temperature Tr. Thus, the chemical liquid processing is performed at the appropriate temperature.

Here, unless otherwise specified, 'heated HDIW' refers to HDIW heated to a temperature higher than the normal set temperature of the HDIW.

Meanwhile, when the chemical liquid discharge standby time is less than the reference standby time, the HDIW of the normal set temperature is applied to the rear surface of the substrate W. In this case, although the temperature of the first substrate W is equal to the temperature of the substrate W in the normal processing, the chemical liquid supplied in the chemical liquid discharging process S2 for the first substrate W has, on the first substrate W, a temperature exceeding the reference processing temperature Tr together with the first substrate W. Therefore, in this case as well, the chemical liquid processing for the first substrate W is performed at the appropriate temperature.

The reference standby time used for the evaluation S11 of the chemical liquid discharge standby time in this way is determined based on the chemical liquid discharge standby time that makes it difficult or impossible for the chemical liquid and the substrate W to have a temperature exceeding the reference processing temperature Tr when the chemical liquid is supplied to the substrate W. Therefore, when the chemical liquid discharge standby time does not exceed the reference standby time, the chemical liquid (i.e., the remaining chemical liquid) supplied to the first substrate W has a temperature exceeding the reference processing temperature Tr on the first substrate W, so that the chemical liquid processing on the first substrate W is appropriately performed.

Additionally, since the degree of the decrease in the temperature of the chemical liquid remaining in the first processing fluid supply 30 varies depending on the characteristics of the chemical liquid and the characteristics of the first processing fluid supply 30, the optimal reference standby time varies depending on the characteristics of the chemical liquid and the characteristics of the first processing fluid supply 30. As an example, when the chemical liquid processing is an etching processing, the reference standby time may be set to be in the range of about 5 minutes to 20 minutes, and, in particular, about 10 minutes to 15 minutes.

In the present exemplary embodiment, in the substrate heating process as described above, the HDIW whose temperature has been adjusted based on the chemical liquid discharge standby time is supplied only to the first substrate W to be processed by the chemical liquid supplied from the first processing fluid supply 30 after the chemical liquid discharge standby time exceeds the reference standby time. Each of the second and subsequent substrates W (for example, the second substrate W of the lot and onward) to be processed after the chemical liquid discharge standby time exceeds the reference standby time is supplied with, on the rear surface thereof, the HDIW having the normal set temperature (i.e., the HDIW having the set temperature regardless of the chemical liquid discharge standby time).

As described above, according to the present exemplary embodiment, when the chemical liquid discharge standby time exceeds the reference standby time, the heated HDIW is applied to the first substrate W to be processed in the preliminary processing process S1 performed prior to the chemical liquid discharging process S2. As a result, the first substrate W may be subjected to the chemical liquid processing in the chemical liquid discharging process S2 in the state that the temperature thereof is raised to a temperature higher than that in a normal chemical liquid processing. Thus, the temperature decrease of the remaining chemical liquid is compensated, and, thus, the first substrate W can be subjected to the chemical liquid processing at an appropriate temperature exceeding the reference processing temperature Tr.

Further, by resuming the supply of the chemical liquid from the first processing fluid supply 30 to the substrate W after discharging the remaining chemical liquid of the reduced temperature from the first processing fluid supply 30 to a place other than the substrate W (that is, after performing dummy discharge), it is also possible to suppress the chemical liquid processing of the substrate W from being performed at a temperature lower than the reference processing temperature Tr. In this case, however, since the remaining chemical liquid is not used for the chemical liquid processing of the substrate W, a yield (throughput) may be reduced. On the contrary, according to the above-described exemplary embodiment, since even the remaining chemical liquid whose temperature has decreased is effectively used for the chemical liquid processing of the substrate W, it is possible to achieve a satisfactory yield.

First Modification Example

When it is necessary to secure a long time as a chemical liquid processing time in the chemical liquid discharging process S2, if the chemical liquid processing is performed over such a long time under a temperature condition higher than the normal set temperature, there may arise cases where the chemical liquid processing on the substrate W becomes excessive. For example, assume that the chemical liquid processing is an etching processing. In this case, if the HDIW with a temperature higher than the normal set temperature is supplied throughout the chemical liquid discharging process S2 on the substrate W that is first processed after the lapse of the chemical liquid discharge standby time, the front surface of the substrate W may be excessively etched.

For this reason, the chemical liquid discharging process S2 may include a process in which the HDIW heated to a temperature higher than the normal set temperature is supplied to the rear surface of the substrate W and a process in which the HDIW having the normal set temperature is supplied to the rear surface of the substrate W. For example, for a certain period of time (e.g., about several tens of seconds) from the start of the chemical liquid discharging process S2, the chemical liquid processing for the substrate W may be performed while supplying the HDIW with the temperature higher than the normal set temperature to the substrate W. Then, after the lapse of the certain period of time, the chemical liquid processing of the substrate W may be performed while supplying the HDIW of the normal set temperature to the substrate W.

Second Modification Example

According to the substrate processing method of the present exemplary embodiment (see FIG. 5), the supply of the HDIW to the rear surface of the substrate W is started before the supply of the chemical liquid CL to the front surface of the substrate W is begun, and is ended after the supply of the chemical liquid CL to the front surface of the substrate W is begun. In this case, the temperature of the HDIW supplied to the substrate W from the second processing fluid supply 35 may change before or after the start of the supply of the chemical liquid CL from the first processing fluid supply 30 to the substrate W (i.e., before or after the start of the chemical liquid discharging process S2).

For example, the HDIW whose temperature has been raised based on the chemical liquid discharge standby time may be applied to the rear surface of the substrate W only in the preliminary processing process S1 (that is, only before the start of the supply of the chemical liquid to the front surface of the substrate W). In this case, in the chemical liquid discharging process S2, the HDIW having a temperature (for example, the normal set temperature) that is set regardless of the chemical liquid discharge standby time may be supplied to the rear surface of the substrate W. As a result, the temperature of the HDIW supplied to the rear surface of the substrate W before the start of the supply of the chemical liquid to the front surface thereof becomes higher than the temperature of the HDIW supplied to the rear surface after the start of the supply of the chemical liquid to the front surface of the substrate W.

Alternatively, in the preliminary processing process S1, the HDIW whose temperature has been raised based on the chemical liquid discharge standby time is supplied to the rear surface of the substrate W. Here, the temperature of the HDIW to be supplied to the rear surface of the substrate W may be gradually reduced after the start of the supply of the chemical liquid to the front surface of the substrate W. In this case, the specific way to lower the temperature of the HDIW to be supplied to the rear surface of the substrate W in the chemical liquid discharging process S2 is not particularly limited. For example, the temperature of the HDIW to be supplied to the rear surface of the substrate W may be gradually reduced immediately after the start of the supply of the chemical liquid to the front surface of the substrate W. Alternatively, the temperature of the HDIW to be supplied to the rear surface of the substrate W may be gradually reduced after a certain period of time elapses from the start of the supply of the chemical liquid to the front surface of the substrate W. Further, in the chemical liquid discharging process S2, the temperature of the HDIW to be supplied to the rear surface of the substrate W may be gradually reduced continuously (for example, proportionally) or intermittently (for example, in a stepwise manner).

Third Modification Example

When the plurality of processing devices 10 provided in the substrate processing system 80 (see FIG. 1) include two or more processing devices 10 configured to perform different chemical liquid processings, the above-described substrate processing method may be applied only to the processing device 10 that performs a certain chemical liquid processing.

For example, the plurality of processing devices 10 may include one or more first-type processing devices 10 each configured to perform a first chemical liquid processing using a chemical liquid having a first composition and one or more second-type processing devices 10 each configured to perform a second chemical liquid processing using a chemical liquid having a second composition. In this case, the controller 93 may perform a control such that the above-described substrate processing method of supplying the HDIW having a temperature higher than a normal temperature to the substrate W to be processed first after the chemical liquid discharge standby time exceeds the reference standby time may be applied only to the first-type processing device 10 (first chemical liquid processing).

In this way, the controller 93 may selectively perform the above-described substrate processing method only in one or more processing devices 10 configured to perform one or more certain types of chemical liquid processings among multiple types of chemical liquid processings.

Fourth Modification Example

The controller 93 may adjust not only the temperature of the HDIW to be supplied to the rear surface of the substrate W but also other conditions related to the HDIW (heated fluid) based on the chemical liquid discharge standby time. For example, the flow rate (that is, a supply amount per unit time) and/or the supply time of the HDIW supplied to the rear surface of the substrate W may be adjusted based on the chemical liquid discharge standby time.

By way of example, with an increase of the chemical liquid discharge standby time, the controller 93 may increase the temperature of the HDIW to be supplied to the rear surface of the substrate W in the substrate heating process (preliminary processing process S1 and/or chemical liquid discharging process S2).

Further, in the substrate heating process, the controller 93 may determine the time to stop the supply of the heated HDIW to the rear surface of the substrate W based on the chemical liquid discharge standby time. That is, the longer the chemical liquid discharge standby time is, the longer the time during which the heated HDIW is supplied to the rear surface of the substrate W may be in the preliminary processing process S1 and/or the chemical liquid discharging process S2.

Additionally, in the substrate heating process, the controller 93 may determine the flow rate of the heated HDIW to the rear surface of the substrate W based on the chemical liquid discharge standby time. That is, as the chemical liquid discharge standby time increases, the flow rate of the heated HDIW supplied to the rear surface of the substrate W may be increased in the preliminary processing process S1 and/or the chemical liquid discharging process S2.

The controller 93 may determine such one or more parameters related to the heated HDIW by referring to a parameter table. In the parameter table, one or more parameters related to the heated HDIW are set in relation to the chemical liquid discharge standby time. This parameter table can be prepared in advance based on results of various experiments and simulations. By way of example, in the parameter table, 'temperature', 'discharge flow rate', and 'discharge time' of the heated HDIW can be related to each of the chemical liquid discharge standby times of '0 minute to 20 minutes', '20 minutes to 40 minutes', '40 minutes to 60 minutes' and '60 minutes or more'.

In addition, whenever the time during which the discharge of the processing fluid (including the chemical liquid) from the first processing fluid supply 30 is not performed continuously reaches a predetermined time, a dummy dispensing process of discharging the processing fluid remaining in the first processing fluid supply 30 from the first processing fluid supply 30 may be performed. In this way, when the discharge of the chemical liquid from the first processing fluid supply 30 is performed at a regular interval (i.e., every regular dummy discharge time), this regular dummy discharge time may be set as a maximum value of the chemical liquid discharge standby time defined in the parameter table.

Fifth Modification Example

In the above-described exemplary embodiment, the HDIW whose temperature has been adjusted based on the chemical liquid discharge standby time is supplied only to the substrate W to be processed first by the chemical liquid supplied from the first processing fluid supply 30 after the chemical liquid discharge standby time exceeds the reference standby time. Here, however, the number of the substrate(s) W to be supplied with the HDIW whose temperature has been raised based on the chemical liquid discharge standby time is not particularly limited.

That is, the HDIW whose temperature has been raised based on the chemical liquid discharge standby time may be supplied only to an N number of substrates W from the first to $N^{th}$ substrates to be processed by the chemical liquid supplied from the first processing fluid supply 30 after the chemical liquid discharge standby time exceeds the reference standby time. Here, 'N' is an arbitrary integer equal to or larger than 1.

'N' here may be determined in any of various ways, and may be a fixed value or a variable value. For example, 'N' may be determined based on the total amount (i.e., sum) of the chemical liquid discharged from the first processing fluid supply 30 after the chemical liquid discharge standby time exceeds the reference standby time. After the total amount of the chemical liquid discharged from the first processing fluid supply 30 after the chemical liquid discharge standby time exceeds the reference standby time exceeds the amount of the chemical liquid remaining in the first processing fluid supply 30, the HDIW of the normal set temperature, not the heated HDIW, may be applied to the substrate W. In this case, the smaller the amount of the chemical liquid used per substrate W (i.e., a discharge amount of the chemical liquid from the first processing fluid supply 30), the larger 'N' may be.

Also, in other embodiments (for example, the above-described modification examples) other than the above-described exemplary embodiment, the number of the substrates W (that is, the aforementioned 'N') supplied with the HDIW whose temperature has been adjusted based on the chemical liquid discharge standby time may be 2 or more.

Second Exemplary Embodiment

In a second exemplary embodiment, components identical or corresponding to those of the above-described first exemplary embodiment will be assigned same reference numerals, and redundant description thereof will be omitted.

Figure 8:
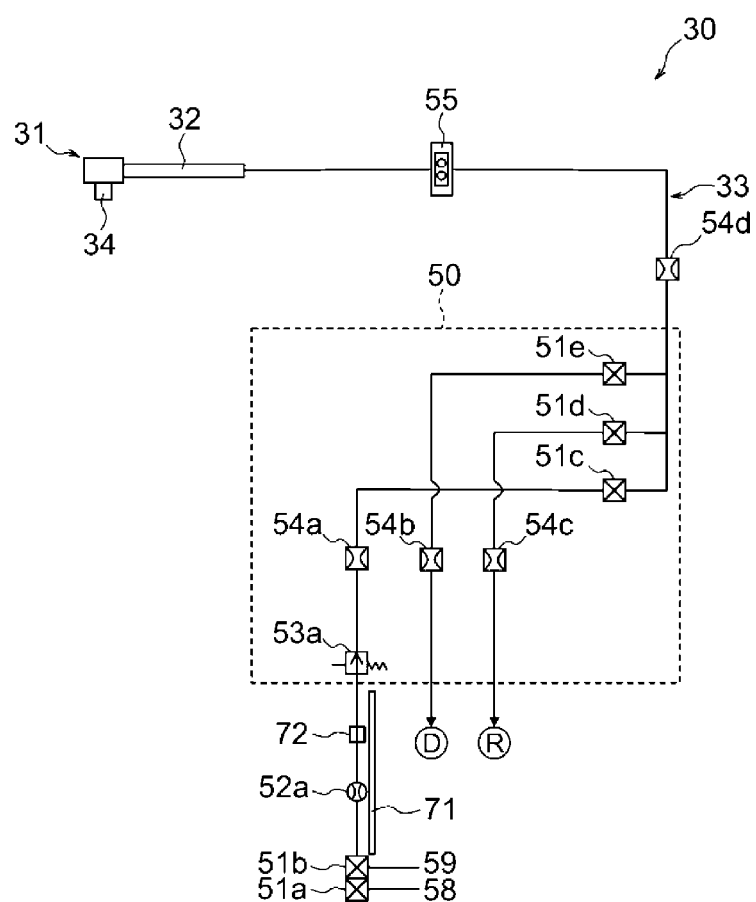
FIG. 8 is a diagram illustrating an example of a pipeline configuration of a first processing fluid supply according to a second exemplary embodiment.

FIG. 8 is a diagram showing an example of a pipeline configuration of the first processing fluid supply 30 according to the second exemplary embodiment.

The first processing fluid supply 30 shown in FIG. 8 is further equipped with a heater 71 and a temperature sensor 72 in addition to the components of the above-described first processing fluid supply 30 shown in FIG. 3.

Under the control of the controller 93 (see FIG. 1), the heater 71 is capable of heating the processing fluid (including the chemical liquid) flowing through the first processing fluid line 33 (in particular, a portion thereof between the first constant-pressure valve 53a and the first and second opening/closing valves 51a and 51b). A specific configuration and form of the heater 71 is not particularly limited. Further, an installation position of the heater 71 is not limited to the position shown in FIG. 8, and one or more heaters 71 may be installed at any position(s) where they are capable of heating at least some of the chemical liquid remaining in the first processing fluid supply 30.

Under the control of the controller 93, the temperature sensor 72 is configured to measure the temperature of the processing fluid (including the chemical liquid) flowing through the first processing fluid line 33 (in particular, the portion between the first constant-pressure valve 53a and the first and second opening/closing valves 51a and 51b), and sends the measurement result to the controller 93. A specific installation position of the temperature sensor 72 is not particularly limited, and the temperature sensor 72 may be installed at any position of the first processing fluid line 33 where it is capable of appropriately detecting a temperature rise of the chemical liquid remaining in the first processing fluid supply 30 heated by the heater 71.

By controlling the heater 71 based on the measurement result of the temperature sensor 72, the controller 93 is capable of adjusting the temperature of the processing fluid (including the chemical liquid) within the first processing fluid line 33 (in particular, the portion between the first constant-pressure valve 53a and the first and second opening/closing valves 51a and 51b) to a required temperature. In particular, in the present exemplary embodiment, the heating of the chemical liquid in the first processing fluid line 33 is controlled based on the chemical liquid discharge standby time, and the chemical liquid whose temperature has been adjusted based on the chemical liquid discharge standby time is supplied to the front surface of the substrate W in the chemical liquid discharging process S2 (chemical liquid processing process).

Other configuration of the substrate processing system 80 (the processing device 10 including the first processing fluid supply 30 and the second processing fluid supply 35) of the present exemplary embodiment is the same as that of the substrate processing system 80 (see FIG. 1 to FIG. 4) according to the first exemplary embodiment described above. Furter, a substrate processing method performed in the processing device 10 of the present exemplary embodiment also includes the preliminary processing process S1, the chemical liquid discharging process S2, the spin-off process S3, the rinsing process S4, and the drying process S5 that are performed in sequence, the same as in the above-described first exemplary embodiment (see FIG. 5).

Figure 9:
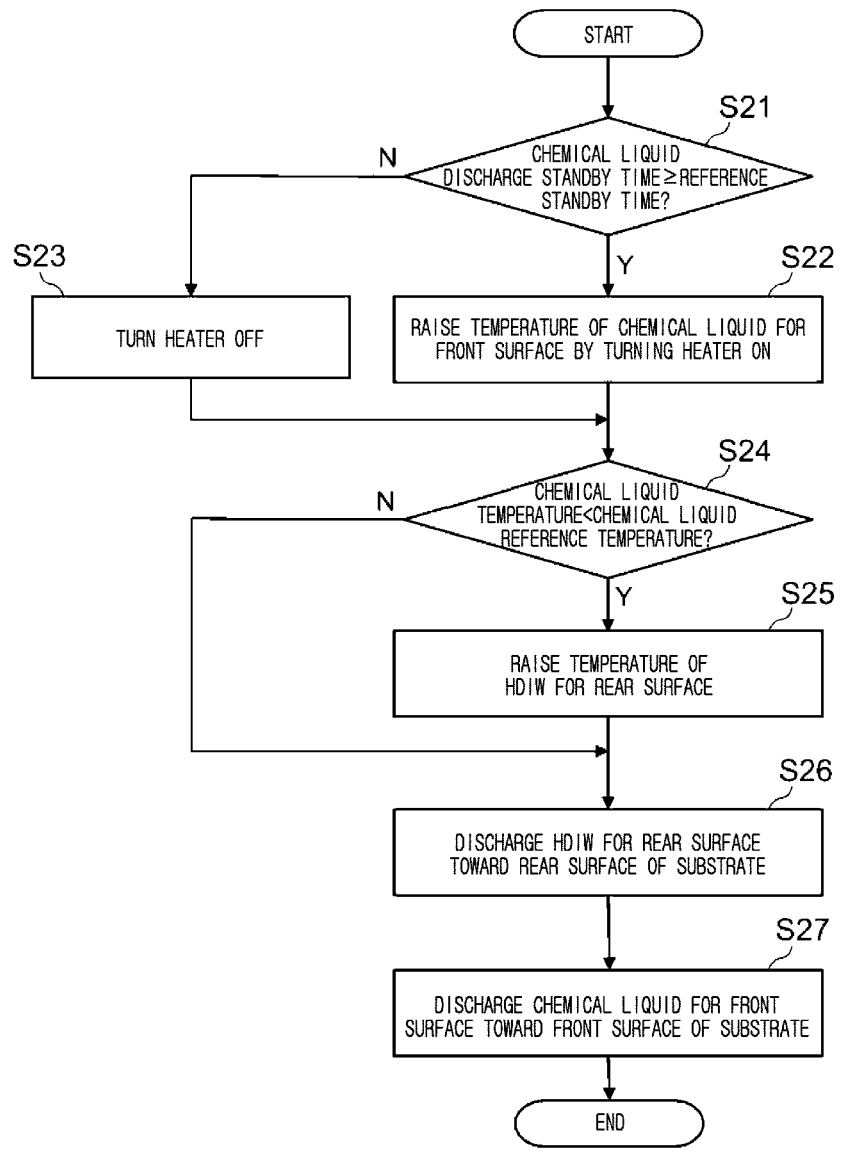
FIG. 9 is a flowchart illustrating an example of a processing flow (particularly, a chemical liquid temperature adjustment flow) of the substrate processing method according to the second exemplary embodiment.

FIG. 9 is a flowchart showing an example of a processing flow (particularly, a chemical liquid temperature adjustment flow) of the substrate processing method according to the second exemplary embodiment. The substrate processing method (including a substrate heating process and a chemical liquid processing process) to be described is performed by the corresponding processing device 10 as the controller 93 (see FIG. 1) appropriately controls the various components of the substrate processing system 80.

In the present exemplary embodiment as well, the controller 93 counts a chemical liquid discharge standby time, the same as in the substrate processing method according to the first exemplary embodiment described above. When the chemical liquid discharge standby time exceeds a reference standby time (Y in S21 of FIG. 9), the heater 71 is put in an ON state under the control of the controller 93, so that a chemical liquid (chemical liquid for front surface) in the first processing fluid line 33 is heated to undergo a temperature rise (S22). Meanwhile, when the chemical liquid discharge standby time is less than the reference standby time (N in S21), the heater 71 is put in an OFF state under the control of the controller 93, so that the chemical liquid in the first processing fluid line 33 is not heated, so its temperature does not increase (S23).

Then, the temperature of the chemical liquid in the first processing fluid line 33 is measured by the temperature sensor 72. The controller 93 raises the temperature of the HDIW to be supplied to the rear surface of the substrate W based on the temperature of the chemical liquid in the first processing fluid line 33 indicated by the measurement result of the temperature sensor 72. Specifically, when the measured temperature of the chemical liquid in the first processing fluid line 33 is lower than a chemical liquid reference temperature (Y in S24), the controller 93 raises the temperature of the HDIW to be supplied to the rear surface of the substrate W (S25). On the other hand, when the measured temperature of the chemical liquid in the first processing fluid line 33 is higher than a chemical liquid reference temperature (N in S24), the temperature raising process S25 for the HDIW is skipped, and the HDIW which is to be supplied to the rear surface of the substrate W is not heated and given a normal set temperature. In this way, the temperature of the HDIW to be supplied to the rear surface of the substrate W is adjusted according to the temperature of the chemical liquid in the first processing fluid line 33.

Thereafter, the preliminary processing process S1 is performed on the substrate W to be processed first by the chemical liquid supplied from the first processing fluid supply 30 after the chemical liquid discharge standby time exceeds the reference standby time, so that the HDIW is supplied to the rear surface of this substrate W (S26). Also, the chemical liquid discharging process S2 is performed on the substrate W to be processed first, and the chemical liquid is supplied to the front surface of this substrate W (S27).

The 'reference standby time' (see S21) in the present exemplary embodiment is determined based on the chemical liquid discharge standby time that makes it difficult or impossible for the chemical liquid and the substrate W to have a temperature exceeding the reference processing temperature Tr when the chemical liquid is supplied to the substrate W, the same as in the first exemplary embodiment.

In addition, the 'chemical liquid reference temperature' (see S24) is determined based on the temperature of the chemical liquid that makes it difficult or impossible for the chemical liquid and the substrate W to have a temperature exceeding the reference processing temperature Tr when the chemical liquid is supplied to the substrate W. The temperature of the substrate W and the chemical liquid during the chemical liquid processing is varied depending on the processing fluid (the DIW and the HDIW in the present exemplary embodiment) applied to the substrate W in the preliminary processing process S1 and the chemical liquid discharging process S2 or depending on such factors as an environmental temperature. For this reason, the optimal chemical liquid reference temperature changes depending on these factors that may affect the chemical liquid processing. As an example, the chemical liquid reference temperature may be determined based on a set temperature (that is, a preset chemical liquid set temperature) of the chemical liquid in the case where the chemical liquid processing is performed under typically assumed conditions. Alternatively, the chemical liquid reference temperature may be decided based on a measurement temperature of the chemical liquid on the substrate W in the case where the chemical liquid of the chemical liquid set temperature is applied to the front surface of the substrate W in the state that the HDIW is not applied to the rear surface of the substrate W in the preliminary processing process S1 and the chemical liquid discharging process S2. As an example, when the chemical liquid processing is an etching processing, the chemical liquid reference temperature may be set to be in the range of about 35° C. to about 50° C., particularly, about 40° C. to about 45° C.

As stated above, according to the present exemplary embodiment, when it is difficult to secure the temperature at which the chemical liquid and the substrate W exceeds the reference processing temperature Tr when the chemical liquid is supplied to the substrate W, the chemical liquid remaining in the first processing fluid supply 30 is heated. Thus, the influence of a decrease in the temperature of the remaining chemical liquid over time on the chemical liquid processing can be reduced. In addition, even in the case where the heater 71 cannot sufficiently heat the chemical liquid to a temperature required to properly process the chemical liquid, the substrate W is heated by supplying the HDIW whose temperature is raised over the normal set temperature to the substrate W. Therefore, the influence of the decrease in the temperature of the remaining chemical liquid over time on the chemical liquid processing can be further reduced.

In this way, in the substrate processing method of the present exemplary embodiment including the above-described series of processes S21 to S27, the chemical liquid processing of the substrate W can be appropriately performed under appropriate temperature conditions. Thus, the substrate processing method of the present exemplary embodiment is advantageous to perform the chemical liquid processing uniformly between substrates.

Other Modification Examples

In the above-described exemplary embodiments and modification examples, the first processing fluid supply 30 may include an insulating material in order to suppress a decrease in the temperature of the chemical liquid remaining in the first processing fluid supply 30 with a lapse of time. For example, by covering the first processing fluid line 33 (as an example, its portion other than the integrated valve main body 50) with the insulating material, a heat transfer between the exterior air and the chemical liquid in the first processing fluid line 33 is reduced, so that a decrease in the temperature of the chemical liquid remaining in the first processing fluid line 33 with a lapse of time is suppressed.

Furthermore, in the above-described exemplary embodiments and modification examples, although the HDIW is used as the heated fluid whose temperature is adjusted based on the chemical liquid discharge standby time, various other fluids may be used instead. It may be assumed that a processing fluid other than the HDIW is supplied to the rear surface of the substrate W from the second processing fluid supply 35 before and/or during the supply of the chemical liquid from the first processing fluid supply 30 to front the surface of the substrate W. In this case, a processing fluid (for example, a cleaning liquid such as SC-1 (a mixture of aqueous hydrogen peroxide solution, aqueous ammonium hydroxide solution, and deionized water)) other than the HDIW is used, instead of the above-described HDIW, as the heated fluid whose temperature is adjusted based on the chemical liquid discharge standby time.

It should be noted that the exemplary embodiments and the modification examples disclosed in the present specification are nothing more than examples in all respects and are not intended to be anyway limiting. The above-described exemplary embodiments and modification examples may be omitted, replaced, and modified in various forms without departing from the scope and spirit of the following claims. For example, the above-described exemplary embodiments and modification examples may be combined in overall or partially, and exemplary embodiments other than those described above may be combined with the above-described exemplary embodiments or modification examples. In addition, the effects of the present disclosure described in the present specification are merely examples, and other effects may be achieved.

The technical category that embodies the above-described technical concept is not particularly limited. For example, the above-described technical concept may be implemented by a computer program for causing a computer to execute one or more processes (steps) included in a method of manufacturing or using the above-described apparatus. Additionally, the above-described technical concept may be implemented by a computer-readable non-transitory recording medium on which such a computer program is recorded.

According to the exemplary embodiment, it is possible to provide the technique advantageous to perform the chemical liquid processing uniformly between the substrates.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing method, comprising:
processing a first surface of a substrate by a chemical liquid supplied to the first surface from a chemical liquid supply; and
heating the substrate by starting a supply of a heated fluid to a second surface of the substrate prior to a start of a supply of the chemical liquid to the first surface of the substrate,
wherein a temperature of at least one of the chemical liquid to be supplied to the first surface or the heated fluid to be supplied to the second surface is adjusted based on a chemical liquid discharge standby time during which a discharge of the chemical liquid from the chemical liquid supply is not performed continuously.

2. The substrate processing method of claim 1,
wherein in the heating of the substrate, the heated fluid whose temperature is adjusted based on the chemical liquid discharge standby time is supplied to the second surface of the substrate.

3. The substrate processing method of claim 2,
wherein in the heating of the substrate, the heated fluid whose temperature is adjusted based on the chemical liquid discharge standby time is supplied only to the substrate to be processed first by the chemical liquid supplied from the chemical liquid supply after the chemical liquid discharge standby time exceeds a reference standby time.

4. The substrate processing method of claim 2,
wherein in the heating of the substrate, the heated fluid whose temperature is adjusted based on the chemical liquid discharge standby time is supplied to an N number of substrates from a first of the substrate to an $N^{th}$ of the substrate processed by the chemical liquid supplied from the chemical liquid supply after the chemical liquid discharge standby time exceeds a reference standby time, and
the N is an integer equal to or larger than 1, and is determined based on a total amount of the chemical liquid discharged from the chemical liquid supply after the chemical liquid discharge standby time exceeds the reference standby time.

5. The substrate processing method of claim 2,
wherein the supply of the heated fluid to the second surface of the substrate in the heating of the substrate is ended after the supply of the chemical liquid to the first surface of the substrate in the processing of the first surface of the substrate is started, and
the temperature of the heated fluid to be supplied to the second surface before the start of the supply of the chemical liquid to the first surface of the substrate is higher than the temperature of the heated fluid to be supplied to the second surface after the start of the supply of the chemical liquid to the first surface of the substrate.

6. The substrate processing method of claim 2,
wherein the supply of the heated fluid to the second surface of the substrate in the heating of the substrate is ended after the supply of the chemical liquid to the first surface of the substrate in the processing of the first surface of the substrate is started, and
the temperature of the heated fluid to be supplied to the second surface is gradually reduced after the start of the supply of the chemical liquid to the first surface of the substrate.

7. The substrate processing method of claim 2,
wherein the temperature of the heated fluid to be supplied to the second surface of the substrate is higher than the temperature of the chemical liquid to be supplied to the first surface of the substrate.

8. The substrate processing method of claim 7,
wherein in the heating of the substrate, the heated fluid whose temperature is adjusted based on the chemical liquid discharge standby time is supplied only to the substrate to be processed first by the chemical liquid supplied from the chemical liquid supply after the chemical liquid discharge standby time exceeds a reference standby time.

9. The substrate processing method of claim 7,
wherein in the heating of the substrate, the heated fluid whose temperature is adjusted based on the chemical liquid discharge standby time is supplied to an N number of substrates from a first of the substrate to an $N^{th}$ of the substrate processed by the chemical liquid supplied from the chemical liquid supply after the chemical liquid discharge standby time exceeds a reference standby time, and
the N is an integer equal to or larger than 1, and is determined based on a total amount of the chemical liquid discharged from the chemical liquid supply after the chemical liquid discharge standby time exceeds the reference standby time.

10. The substrate processing method of claim 7, wherein the supply of the heated fluid to the second surface of the substrate in the heating of the substrate is ended after the supply of the chemical liquid to the first surface of the substrate in the processing of the first surface of the substrate is started, and the temperature of the heated fluid to be supplied to the second surface before the start of the supply of the chemical liquid to the first surface of the substrate is higher than the temperature of the heated fluid to be supplied to the second surface after the start of the supply of the chemical liquid to the first surface of the substrate.

11. The substrate processing method of claim 7, wherein the supply of the heated fluid to the second surface of the substrate in the heating of the substrate is ended after the supply of the chemical liquid to the first surface of the substrate in the processing of the first surface of the substrate is started, and the temperature of the heated fluid to be supplied to the second surface is gradually reduced after the start of the supply of the chemical liquid to the first surface of the substrate.

12. The substrate processing method of claim 1, wherein the temperature of the heated fluid to be supplied to the second surface of the substrate is higher than the temperature of the chemical liquid to be supplied to the first surface of the substrate.

13. The substrate processing method of claim 1, wherein the supply of the heated fluid to the second surface of the substrate in the heating of the substrate is ended after the supply of the chemical liquid to the first surface of the substrate in the processing of the first surface of the substrate is begun.

14. The substrate processing method of claim 1, further comprising:
supplying a processing fluid having a temperature lower than that of the heated fluid to the second surface of the substrate after the supply of the chemical liquid to the first surface of the substrate from the chemical liquid supply is ended.

15. The substrate processing method of claim 1, wherein at least one of a flow rate or a supply time of the heated fluid supplied to the second surface of the substrate in the heating of the substrate is determined based on the chemical liquid discharge standby time.

16. The substrate processing method of claim 1, wherein the temperature of the heated fluid to be supplied to the second surface of the substrate in the heating of the substrate is raised with an increase of the chemical liquid discharge standby time.

17. The substrate processing method of claim 1, wherein in the processing of the first surface of the substrate, the chemical liquid whose temperature is adjusted based on the chemical liquid discharge standby time is supplied to the first surface of the substrate.

18. The substrate processing method of claim 17, wherein the chemical liquid supply comprises a chemical liquid line, and a chemical liquid discharger configured to discharge the chemical liquid supplied through the chemical liquid line, and heating of the chemical liquid in the chemical liquid line is controlled based on the chemical liquid discharge standby time.

19. The substrate processing method of claim 18, further comprising:
measuring the temperature of the chemical liquid in the chemical liquid line,
wherein the temperature of the heated fluid to be supplied to the second surface of the substrate is adjusted based on the temperature of the chemical liquid in the chemical liquid line.

20. A substrate processing system, comprising:
a substrate holder configured to hold multiple substrates;
a substrate processing apparatus configured to process each substrate;
a substrate transfer device configured to transfer each substrate between the substrate holder and the substrate processing apparatus; and
a processing controller configured to control the substrate processing apparatus,
wherein the substrate processing apparatus comprises:
a substrate support configured to support the substrate;
a chemical liquid supply configured to supply a chemical liquid to a first surface of the substrate; and
a fluid supply configured to supply a heated fluid to a second surface of the substrate,
wherein the processing controller controls the substrate processing apparatus to perform:
processing the first surface of the substrate by the chemical liquid supplied to the first surface from the chemical liquid supply; and
heating the substrate by starting a supply of the heated fluid to the second surface of the substrate prior to a start of a supply of the chemical liquid to the first surface of the substrate, and
wherein a temperature of at least one of the chemical liquid to be supplied to the first surface or the heated fluid to be supplied to the second surface is adjusted based on a chemical liquid discharge standby time during which a discharge of the chemical liquid from the chemical liquid supply is not performed continuously.

* * * * *